United States Patent [19]
Gupta et al.

[11] Patent Number: 5,246,729
[45] Date of Patent: Sep. 21, 1993

[54] METHOD OF COATING SUPERCONDUCTORS WITH INORGANIC INSULATION

[75] Inventors: Tapan K. Gupta, Monroeville; George J. Bich, Pittsburgh, both of Pa.; William N. Lawless, Westerville, Ohio

[73] Assignee: United States of America as represented by the Secretary of the Air Force, Washington, D.C.

[21] Appl. No.: 171,502

[22] Filed: Mar. 10, 1988

Related U.S. Application Data

[62] Division of Ser. No. 880,243, Jun. 30, 1986, abandoned, and Ser. No. 880,244, Jun. 30, 1986, abandoned.

[51] Int. Cl.$^5$ .............................................. B05D 5/12
[52] U.S. Cl. ...................................... 427/62; 427/118
[58] Field of Search ........................... 427/62; 428/381

[56] References Cited

U.S. PATENT DOCUMENTS

| | | | |
|---|---|---|---|
| 3,078,186 | 2/1963 | Tierney | 117/201 |
| 3,089,787 | 5/1963 | Sattler et al. | 117/215 |
| 3,109,053 | 10/1963 | Ahearn | 174/110 |
| 3,119,897 | 1/1964 | Coper | 174/110 |
| 3,222,219 | 12/1965 | Saunders et al. | 117/218 |
| 3,223,553 | 12/1965 | Morey | 117/215 |
| 3,291,638 | 12/1966 | Stadlen et al. | 117/231 |
| 3,442,702 | 5/1969 | Pendleton et al. | 117/217 |
| 3,446,660 | 5/1969 | Pendleton | 117/218 |
| 3,749,811 | 7/1973 | Bogner et al. | 174/15 C |
| 3,883,370 | 5/1975 | Kanter | 148/6.35 |
| 3,985,281 | 10/1976 | Diepers | 228/148 |
| 4,178,677 | 12/1979 | Weisse | 29/605 |
| 4,261,097 | 4/1981 | Weisse | 29/599 |
| 4,407,062 | 10/1983 | Sutcliffe et al. | 29/599 |
| 4,429,007 | 1/1984 | Bich et al. | 428/389 |

OTHER PUBLICATIONS

W. N. Lawless et al., "Enthalpy-Improved Dielectric Insulation for Superconducting Wires", AFWAL-TR-82-2056, May 1982, Aero Propulsion Laboratory, Wright-Patterson AFB OH 45433.
*Encyclopedia of Chemical Technology*, Ed. by Kirk Othmer, 3rd ed., vol. 11, pp. 807-890.
T. Gupta et al., "Dielectric Insulation for Superconductors", AFWAL-TR-85-2070, Sep. 1985, Wright Laboratories, Wright-Patterson AFB OH 45433.

*Primary Examiner*—Sam Silverberg
*Attorney, Agent, or Firm*—Bernard E. Franz; Donald J. Singer

[57] ABSTRACT

The composite insulation coating consists of a mixture of glass and ceramic oxide(s), coated onto a wire by conventional wire enameling techniques followed by heat treatment at 600°-850° C. The enamel when initially applied, the "green" coat slurry, consists of four components: (1) the glass, (2) an inorganic filler (ceramic oxide powder, (3) an organic binder and (4) an organic solvent. The glasses can be selected from several commercial glasses (Corning 7570 and 7050) as well as Westinghouse glasses A-508, M 3072 and M 3073. None of these glasses contain lead or boron, allowing for nuclear applications. Suitable ceramic fillers are alumina, and the CeramPhysics, Inc. ceramics SC1C and SC1A. Organic binder materials and solvents are used. It is preferable that a copper wire to be coated with Ni, Inconel or Cr prior to coating with the subject insulation. For superconductors, the brittle nature of $Nb_3Sn$ wire and the high reaction temperature ($\sim 700°$ C.) required to form it preclude the use of standard organic insulation systems. The inorganic insulation with SC1C and SC1A ceramics, characterized by unusually high specific heats and thermal conductivities at cryogenic temperatures, offers the opportunity of providing increased enthalpy stabilization in a superconducting winding. The glass and ceramic is chosen so that the vitrification temperature of the composite coincides with the reaction temperature of 600°-800 ° C. The most successful glasses meeting this criterion are A-508 and M3072.

3 Claims, 3 Drawing Sheets

INSULATION RESISTANCE OF VARIOUS INORGANIC COATINGS

5,246,729

METHOD OF COATING SUPERCONDUCTORS WITH INORGANIC INSULATION

RIGHTS OF THE GOVERNMENT

The invention described herein may be manufactured and used by or for the Government of the United States for all governmental purposes without the payment of any royalty.

RELATED PATENT APPLICATIONS

This application is a division of patent application Ser. No. 06/880,243 (now abandoned) entitled "Inorganic Wire Insulation for Superconducting Wire", and Ser. No. 06/880,244 (now abandoned) entitled "High Temperature and Radiator Resistant Inorganic Insulation for Conventional Conductors", both filed Jun. 30, 1986.

An application Ser. No. 07/205,029 titled "Superconducting Wire with Inorganic Insulation", filed Jun. 9, 1988, is a continuation of Ser. No. 06/880,243 now abandoned.

BACKGROUND OF THE INVENTION

This invention relates to a method of coating conductors with inorganic insulation, and more particularly for coating superconducting niobium-tin ($Nb_3Sn$) wire, or for coating conventional conductors (for use at ambient temperatures) with a high temperature and radiation resistant inorganic insulation.

Fast pulse superconducting magnets for use in airborne AC generators, MHD generators, and energy storage devices require high current, high field, low loss, stable superconductors and associated insulation systems. The multifilamentary $Nb_3Sn$ superconductor has emerged as the most promising conductor for use in these machines. However, while the electrical properties of multifilamentary $Nb_3Sn$, with regard to both high current density and low loss, are advantageous, its mechanical properties lead to other problems. A major concern in developing an insulation system for $Nb_3Sn$ is the high formation temperature (600°–800° C.) of $Nb_3Sn$ and the fact that it is a brittle intermetallic compound and after its formation cannot be readily deformed. Its formation reaction at the formation temperature must be carried out when the wire is in its final geometry. An ideal insulation system would, therefore, be one that will not only withstand the breakdown voltage of several hundred volts at liquid He temperature but also withstand the superconductor reaction temperature of 600°–800° C. The insulation should be capable of being applied before reaction, be able to withstand the time-temperature excursion during reaction, and have no adverse effects on the electrical and mechanical properties at low superconducting temperature. In addition, it should provide good thermal contact between the wire and the enthalpy stabilizer, which is usually liquid helium, or in the best case, provide a measure of stabilization itself. This requires that the insulation must withstand this high formation temperature and yet be electrically satisfactory at low use temperature (4°–8° K.). A further requirement of the insulation is that is must absorb the energy dissipated during fast charge and discharge of the magnet. The energy must be absorbed without allowing the temperature of the conductor to rise high enough to quench the magnet.

U.S. Pat. Nos. of interest include 4,407,062 to Sutcliffe et al; 4,261,097 to Weisse; 4,178,677 to Weisse; 3,985281 to Diepers; and 3,749,811 to Bogner et al. The Sutcliffe et al '062 patent relates to a method of insulating superconductive wire by coating a $Nb_3Sn$ precursor wire with a layer of a mixture of a silicate of sodium, lithium or potassium and a second component capable of reacting with the silicate to form a ceramic, such as alumina, drying the coating and heating the coating to a temperature in excess of 500° C. to react the silicate and the second component to form the insulating ceramic. The Weisse '097 patent disclosed insulating superconductor magnet windings with ceramics, glass, or quartz in the form of filaments, fabrics or nonwoven fabrics. The remaining references are of general interest.

The usual approach to electrical wire insulation for conventional conductors is to use organic enamel composed of organic high molecular materials, such as polyesters and polyimides. In many cases, these coatings are protected by a metal sheath for mechanical protection. The temperature capabilities of these organic coatings are between 100°–200° C., rendering the wire very susceptible to fire and toxic fumes. In addition, they suffer from radiation damage in a nuclear environment. On the other hand, as a result of rapid technological process in aerospace and nuclear power developments, electrical wire manufacturers today are faced with a small supply of super heat-resistant and radiation-resistant enameled wires which are beyond the limits of conventional wires with organic insulation. In the past, the use of inorganic coating such as ceramics has been severely limited due to difficulty in fabrication and to the brittle nature of these materials.

U.S. Pat. No. 4,429,007 to Bich et al covers an electromagnetic coil for high temperature and high radiation application in which glass is used to insulate the electrical wire. A process for applying the insulation to the wire is disclosed which results in improved insulation properties.

Other U.S. Pat. Nos. of interest include 3,883,370 to Kanter; 3,446,660 to Pendleton; 3,442,702 to Pendleton et al; 3,291,638 to Stadlen et al; 3,223,553 to Morey; 3,222,219 to Saunders et al; 3,089,787 to Sattler et al; 3,078,186 to Tierney; 3,109,053 to Ahearn; and 3,119,897 to Coper.

The Pendleton et al '702 patent disclosed a high temperature electrical conductor insulated with a fused glass matrix free of boron and is alumina-free, but does contain calcium fluoride. Refractory chromium oxide, alumina, silica or titania particles are intermixed with the glass frit in the resin and solvent of the enamel coating. The copper conductor has a nickel or nickel alloy surface. The glass particles equal 50–100% of the weight of the resin. The glass is mixed with 10–30% of its weight of the refractory oxide such as $Cr_2O_3$ also dispersed in the resin. The Saunders et al '219 patent contains disclosures relating to separate glass frit and refractory material phases. The remaining references are provided as being of general interest.

The *Encylopedia of Chemical Technology*, Ed. by Kirk-Othmer, third edition, Vol. 11, at pages 807–890 has an article on glass, and at pages 881–890 has an article on glass-ceramics. Note particularly pages 826–827 for a table, hereby incorporated by reference, which includes the composition of Corning glasses 7052 and 7570.

SUMMARY OF THE INVENTION

An objective of the invention is to provide a method of coating superconducting wire with insulation for fast pulse superconducting magnets for use in airborne AC generators, MHD generators, and energy storage devices which require high current, high field, low loss, stable superconductors and associated insulation systems.

Another objective is to provide coating with insulation which can withstand the high formation temperature and yet be electrically satisfactory at low use temperature (4°-8° K.). A further objective is to provide insulation that is able to absorb the energy dissipated during fast charge and discharge of the magnet.

One feature of the invention relates to a method of coating superconducting $Nb_3Sn$ wire with an inorganic insulation system which consists of a composite powder and vitrified at a temperature which coincides with the superconducting formation temperature of 600°-800° C. The inorganic composite insulation consists of a glass and ceramic powder. However, critical to the development of inorganic insulation for superconducting $Nb_3Sn$ is that the glass and the ceramic be chosen in such a way that the vitrification temperature of the composite coincides with the reaction temperature of 600°-800° C. The most successful glasses meeting this criterion are two Westinghouse glasses designated A-508 and M3072. Suitable ceramic fillers are the Ceram Physics, Inc. ceramics SC1C and SC1A. The organic binders and solvents are similar to those disclosed in said related patent application. Cladding or plating with, e.g., nickel is preferable for the copper layer of $Nb_3Sn$ wire.

Another objective of the invention is to provide a method of coating with an inorganic enamel insulation coating for a variety of conducting wires which will meet the goals described in the "Background" section above.

Another feature of the invention relates to a high temperature and radiation-resistant inorganic insulation coating for a variety of conductors. The composite insulation coating consists of a mixture of glass and ceramic oxide(s), coated onto the wire by conventional wire enameling techniques followed by heat treatment at 600°-850° C. The enamel when initially applied, the "green" coat slurry, consists of four components: (1) the glass, (2) an inorganic filler (ceramic oxide powder, (3) an organic binder and (4) an organic solvent. The glasses can be selected from several commercial glasses as well as Westinghouse glasses A-508, M 3072 and M 3073, which do not contain lead or boron, allowing for nuclear applications. Various inorganic filler materials—oxide ceramic powders including alumina, silica or magnesia as well as binder materials and solvents are disclosed. It is preferable that a copper wire be coated with Ni, Inconel or Cr prior to coating with the subject insulation. It is noted that the oxide ceramic powders alumina, silica and magnesia can also be components of the glass constituent.

DETAILED DESCRIPTION

The Bich et al U.S. Pat. No. 4,429,007, which is hereby incorporated by reference, includes a table giving the composition of the Westinghouse glasses M3072, M3073 and M3074 with a range and a preferred weight percent. A paper relating to the invention titled "Inorganic Dielectric Insulation for Superconducting $Nb_3Sn$ Wire", which is hereby incorporated by reference, was published at pages 225-234 of *Advances in Cryogenic Engineering Materials*, Volume 32 (1986), (Proceedings of the Sixth International Cryogenic Materials Conference (ICMC), held Aug. 12-16, 1985 in Cambridge, Mass.).

SUPERCONDUCTOR EMBODIMENT

Fast pulse superconducting magnets for use in airborne AC generators, MHD generators, and energy storage devices require high current, high field, low loss, stable superconductors and associated insulation systems. The multifilamentary $Nb_3Sn$ superconductor has emerged as the most promising conductor for use in these machines. A major concern in developing an insulation system for $Nb_3Sn$ is the high formation temperature (700°-800° C.) of $Nb_3Sn$ and the fact that it is brittle after its formation and cannot be deformed. This requires that the insulation must withstand this high formation temperature and yet be electrically satisfactory at low use temperature (4°-8° K.). A further requirement of the insulation is that is must absorb the energy dissipated during fast charge and discharge of the magnet. The energy must be absorbed without allowing the temperature of the conductor to rise high enough to quench the magnet.

A unique opportunity to achieve the objectives of the invention is offered by the possible application of a new class of dielectric material as insulation coating for the $Nb_3Sn$ wire. These materials (W. N. Lawless, C. F. Clark, R. W. Arnez, Final Report AFWAL-TR-82-2056 Air Force Contract 33615-80-C-2022, 1982 available from NTIS as AD-131857) are characterized by high specific heats and thermal conductivities at low temperature and thus can provide large enthalpy for thermal stabilization of superconducting wires. Recent advances in the development of thin dielectric coatings have proven beyond doubt that these enthalpy stabilizing materials can be successfully applied very close to the potential heat source; i.e., directly on the superconductor as an insulation coating.

With this objective in mind, the Air Force has supported a series of programs for developing an enthalpy stabilizing dielectric film-type coating for superconducting $Nb_3Sn$ wire, using these materials incorporated in a glassy matrix. The development of this composite insulation system is described herein. A copy of a Final Report titled "Dielectric Insulation for Superconductors", dated September 1985, under Air Force Contract F33615-82-C-2227, is attached hereto, and is hereby incorporated by reference.

The broad picture is to incorporate the enthalpy stabilizing dielectric powders into appropriate glasses for the purpose of coating $Nb_3Sn$ wire, thereby providing not only the electrical insulation, but also a significant enthalpy stabilization to the superconductor. Presented hereinafter is the state-of-the-art characteristic of this insulation system, with special emphasis on properties and compatibility between the insulation and the wire.

CRITICAL CONSIDERATIONS FOR DEVELOPING ENTHALPY STABILIZED DIELECTRIC COATING

Three critical considerations are required for designating the dielectric coating: 1) enthalpy stabilization of the coating, 2) high formation temperature (700°-800° C.) of $Nb_3Sn$, and 3) compatibility between coating and $Nb_3Sn$. These considerations are briefly described in the following.

1) Enthalpy stabilization refers to the ability of the coating to absorb thermal energy produced within the magnet winding. The coating acts as a buffer; the thermal energy is eventually conducted to the helium coolant. The time scale of the disturbance and the geometry of the winding determine which thermal properties of the coating material are most important. The spatial distribution of the disturbance does not affect which thermal properties are most important for the coating, but only the relative importance of the thermal properties of the coating and the wire. Three cases can be identified. The thermal relaxation time, t, of the coating is needed to identify these cases and is given by $$t = d^2/a \qquad (1)$$

where d is the coating thickness, and a is the thermal diffusion coefficient. For disturbances shorter than the thermal relaxation time, the thermal energy absorbed by the coating is proportional to the thermal property group (M. Jakob and G. Hopkins, "Elements of Heat Transfer," J. Wiley (1957), p. 65)

$$h = \sqrt{KpC} = K/\sqrt{a} \qquad (2)$$

where K is the thermal conductivity, p is the density, and C is the gravimetric specific heat. The second case occurs when the disturbance is no longer than t and the coating is not in direct contact with helium or any other thermal energy absorbed by the coating is then proportional to the volumetric heat capacity, C-pc. The third case occurs when the disturbance time is longer than t and the coating is in direct contact with a thermal energy sink such as a helium bath. The thermal energy absorbed by the coating can then be passed on to the heat sink, and the energy absorbed becomes proportional to the thermal conductivity, K, of the coating. To summarize, either by h, K, or C can be the most important thermal property of the coating, depending upon the temporal length of the disturbance and the winding geometry.

2) The second constraint comes from the high formation temperature of $Nb_3Sn$ and the poor strain tolerance of the formed $Nb_3Sn$. The $Nb_3Sn$ is generally formed by heat treating at temperature between 700°-800° C. for many hours. Once it is formed it is brittle, and straining the wire more than 0.07% degrades the critical current. This requires that the winding be carried out prior to formation reaction. Consequently, the insulation that needs to be developed should be capable of being applied before the reaction, be able to withstand the time-temperature excursion during the reaction, and should exhibit no adverse effect on electrical or mechanical properties of the wire. Because of the high reaction temperature, the organics are thus ruled out, and inorganics are prescribed.

3) The third constraint is imposed by the compatibility requirement between the insulation and the superconductor. The insulation must be compatible with electrical, mechanical, thermal, and chemical properties of the $Nb_3Sn$ superconductor. It must not degrade the superconducting current while exhibiting high electrical resistance, high breakdown voltage, and satisfactory enthalpy stabilization in zero and intense magnetic field. It is desired that the formation temperature of the coating and the reaction temperature of $Nb_3Sn$ be the same, and no adverse chemical reaction occurs between the insulation and the superconductor. To achieve this goal, it was necessary to use a protective layer of nickel on the outer copper substrate of the $Nb_3Sn$ wire, although other metals were also found satisfactory.

DETAILS OF INVENTION

As has been learned previously, the formation of an inorganic coating requires initially (green coat) a mixture of (1) a glass, (2) an inorganic ceramic oxide, (3) an organic binder and (4) a solvent. Critical to the development of inorganic insulation for superconducting $Nb_3Sn$ is that the glass and the ceramic be chosen in such a way that the vitrification temperature of the composite consisting of the glass and the ceramic coincides with the reaction temperature of 600°-800° C. as discussed before. The most successful glasses which meet the above criteria are the two Westinghouse glasses designated as A508 and M3072 (see Table I). The $Al_2O_3$ is a good ceramic filler in the composite and has satisfactory thermal properties at liquid He temperature to provide a built-in enthalpy stabilization in the coating itself. The other ceramic oxide powders are trade named SC1C and SC1A ceramics made by Ceram Physics Inc. of Westerville, Ohio. These ceramics are known to have high specific heat and thermal conductivity at liquid He temperature, and experiments have shown that they maintain these properties in the composites. Inorganic coatings made with $Al_2O_3$, SC1C and SC1A in combination with A-508 and M3072 glasses show excellent electrical and thermal properties as described in the monthly reports to the Air Force under contract #F33615-82-C-2227 and 2229. The organic binders and solvents are similar to those described in our said related patent application.

Since the superconducting $Nb_3Sn$ is normally formed by embedding in a copper matrix, the outer layer of the wire is copper metal. The fact that the inorganic insulation as well as the superconducting reactions will require an excursion to a temperature of 600°-800° C., preferably in an oxidizing atmosphere, made it necessary to consider a protective layer on the copper substrate either as an inert material or as a protective coating that will accept a suitable insulation. Past experience has shown that a suitable metal layer on copper substrate will satisfy this requirement. This metal layer can be applied either by cladding or preferably, by plating. A host of protective metal layers have been evaluated for this program and Ni, Inconel and Cr were found to be satisfactory. Of these, Ni is most preferable because it can be plated onto the outer copper layer of Nb$_3$Sn wire without a major problem.

The properties of the insulation coating evaluated can be summarized as follows. There was no degradation of the critical current of the superconducting wire upon application of the insulation. A breakdown voltage of approximately 500–1000 volts/mil and an electrical resistance of $10^{10}$-ohm on twisted pair were obtained at liquid nitrogen temperature. These insulations showed good adhesion and high scrape and abrasion resistance upon vitrification. In the green state, the insulated wire could be bent and stretched to form a coil. Desirable thermal properties were imparted to the insulation by incorporating SC1C and SC1A to the composite as described previously. Furthermore, the coating did not show any degradation in magnetic field or under thermal shock condition.

Many coating compositions were evaluated during this study. The satisfactory range of composition in the "green" and "vitrified" states can be summarized as follows:

| (a) Green Coating Composition | |
|---|---|
| Glass | 35–45% |
| Ceramic | 20–30% |
| Organic Binder | 30–40% |
| (b) Vitrified Coating Composition | |
| Glass | 55–65% |
| Ceramic | 35–45% |

TABLE I

COMPOSITIONS OF WESTINGHOUSE GLASSES
weight %

| Oxides | A-508 | M3072 | M3073 |
|---|---|---|---|
| SiO$_2$ | 40.00 | 55.00 | 55.00 |
| Al$_2$O$_3$ | 6.00 | 4.00 | 4.00 |
| K$_2$O | 12.00 | — | — |
| Na$_2$O | 8.00 | 11.00 | — |
| BaO | 10.00 | 20.00 | 20.00 |
| SrO | 2.00 | — | — |
| CaO | 3.00 | 6.00 | 6.00 |
| MgO | 0.50 | — | 9.00 |
| ZnO | 6.00 | — | — |
| TiO$_2$ | 2.00 | — | — |
| V$_2$O$_5$ | 6.00 | — | — |
| AS$_2$O$_3$ | 0.50 | — | — |
| Li$_2$O | 4.00 | — | — |
| Y$_2$O$_3$ | — | 4.00 | 6.00 |

Note from the Bich et al U.S. Pat. No. 4,429,007, the Table I shows preferred compositions, and that the glasses have ranges, with the glass M3072 having a composition comprising by weight 40–60% SiO$_2$, 2–6% Al$_2$O$_3$, 6–13% Na$_2$O, 15–25% BaO, 3–10% CaO, and 2–10% Y$_2$O$_3$; and the glass M3073 having a composition comprising by weight 40–60% SiO$_2$, 2–6% Al$_2$O$_3$, 15–25% BaO, 3–10% CaO, 6–13% MgO and 2–10% Y$_2$O$_3$.

EXPERIMENTAL RESULTS

A large number of materials and combinations thereof were studied, as disclosed in the Final Report titled "Dielectric Insulation for Superconductors", dated September 1985, under Air Force Contract F33615- 82-C-2227, attached hereto. A few examples are presented here of the coating composition and its characteristics from a broad range of studies undertaken.

Two high specific heat ceramics reported here are: SC1C, a chromite-spinel ceramic, and SC1A, a niobate-columbite ceramic. The SC1C has an enormous specific heat maxima at 8° K. of 2 J cm$^{-3}$K$^{-1}$, and SC1A has a specific heat maximum at 4.2° K. of 0.3 J cm$^{-3}$K$^{-1}$. Of several glasses investigated in this study, the one that will be discussed here is labeled 3072, developed specifically for this study. In a previous study (W. N. Lawless, C. F. Clark, and T. K. Gupta, in *Advances in Cryogenic Engineering (Materials)*, Vol. 30, ed. A. F. Clark and R. P. Reed, Plenum Press, New York (1984), pp. 433–440), other glasses, were investigated in making a composite with SC1C and SC1B, a ceramic analagous to SC1A. Adhesion of the Corning glasses to the wire proved unsatisfactory, so new glasses were developed which showed much improved adhesion. Pore-free bulk samples of cylindrical shape were prepared of various compositions by hot pressing at 800° C. The composite compositions that will be reported in this paper for bulk samples are: 50/50 weight ratios of SC1A/3072, SC1C/3072, and a ternary composite 32/18/50 SC1C/SC1A/3072. Simultaneous studies were conducted on composite compositions for coating and the one that will be described here is 40/60 SC1C/3072. The reason for higher glass content was to ensure better adhesion of the coating to the wire. This reduced the thermal characteristics only very slightly. The coating was applied by first preparing a slurry of a mixture of glass, ceramic, organic binder, and solvent, and then drawing the wire through the slurry using the conventional wire enameling equipment. The coating thus developed is called the "green coating", which is then heat treated at 700°–800° C. to obtain what is known as "fired" or "vitrified" coating. At this stage, the glass has melted with the ceramic embedded in the glass and adhered strongly to the wire. The green coating is flexible enough to allow twisting, bending, and coiling. The tests samples are prepared from the green coating in the form of a twisted pair, standard in organic enamel industry (according to IEEE specification), and heat treated at various temperatures to obtain the vitrified test samples.

BULK SAMPLES

Specific heat and thermal conductivity data (zero field) were measured in the adiabatic calorimeter described elsewhere (W. N. Lawless, Phys. Rev. B14, p. 134). Specific heat measurements in intense magnetic fields were performed at National Magnet Laboratory (MIT) by a drift technique using capacitance thermometry (W. N. Lawless, C. F. Clark, R. W. Arnez, Rev. Sci. Instrum. 53, (1982), p. 1647).

Figure 1:
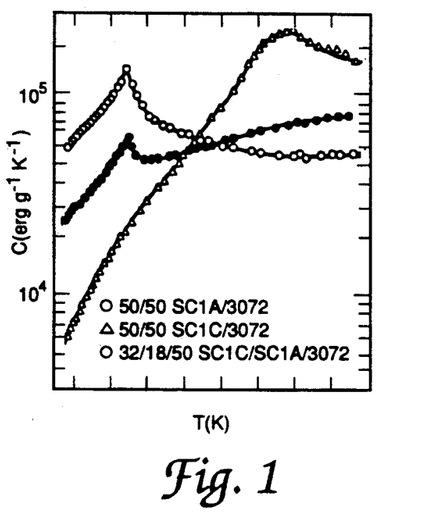
FIG. 1 is a graph showing the specific heat of ceramic/glass composites.

The specific heat data on pore-free SC1A/3072, SC1C/3072, and SC1A/SC1C/3072 composites are shown in FIG. 1. The sharp peak for SC1A and the broad-based peak for SC1C bulk ceramics at appropriate temperatures are maintained in the composites, indicating the absence of any adverse reaction between the ceramic and the glass. The broad maximum centered at approximately 8° K. for SC1C/3072 composite may be due to correlation effects in the fine grain (approximately 1 mm) SC1C powder also observed previously for SC1C/7570 composite (W. N. Lawless, C. F. Clark, and T. K. Gupta, in *Advances in Cryogenic Engineering (Materials)*, vol. 30, ed. A. F. Clark and R. P. Reed, Plenum Press, New York (1984).

Figure 2:
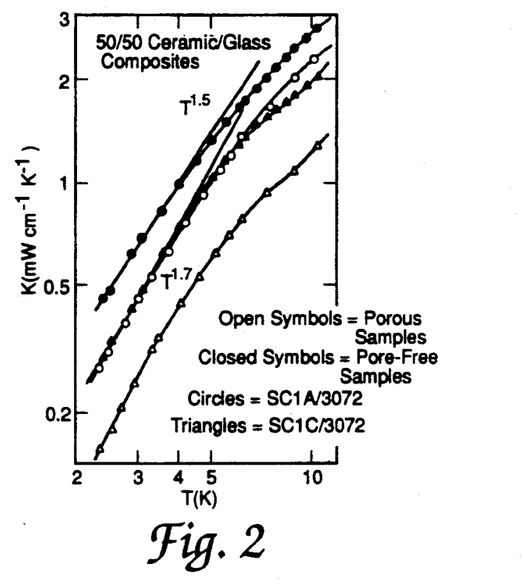
FIG. 2 is a graph showing the thermal conductivities of dense and porous ceramic/glass composites.

Thermal conductivity data measured on the 50/50 ceramic/glass composites are shown in FIG. 2. Also shown in this figure is the results on samples which had approximately 10% porosity. Porosity decreases the SC1C/3072 thermal conductivity by approximately 31%. These results are of import because the coating was nearly 100% dense, and we intended to correlate the bulk thermal data to those of coatings. Turning further to FIG. 2, the thermal conductivities follow $KaT^m$ where $m=1.5$ and 1.7 for SC1A/3072 and SC1C/3072 composites, respectively. To a first approximation, one would associate these exponents to Kapitza limited phenomena, but other studies have indicated that there are no Kapitza effects in SC1C/3072 composite. We remark here that the absence of Kapitza effect is one of the reasons for choosing SC1C/3072 composite as a leading candidate for wire coating.

Figure 3:
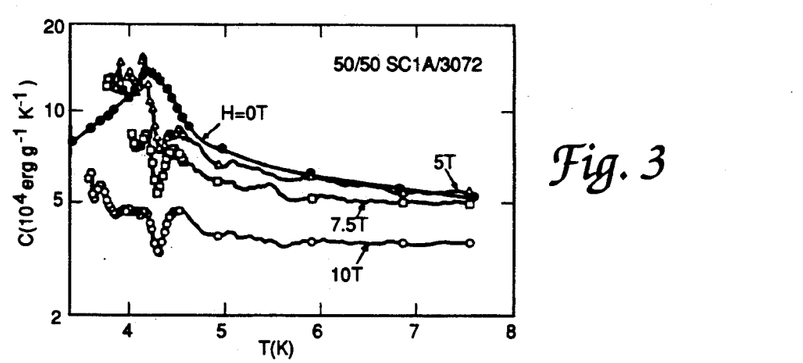
FIG. 3 is a graph showing the magnetic-field dependence of the specific heat of SC1A/3072 composite.
Figure 4:
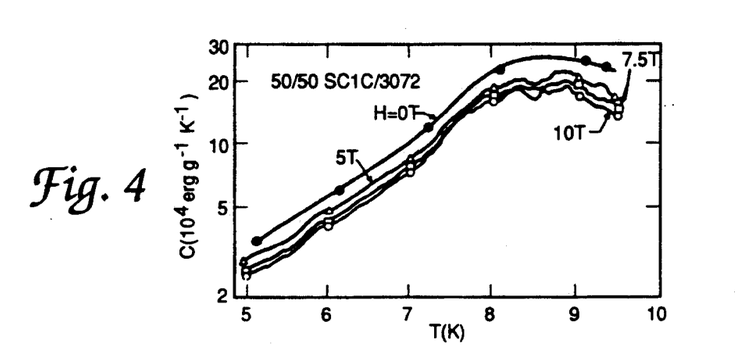
FIG. 4 is a graph showing the magnetic-field dependence of the specific heat of SC1C/3072 composite.

Specific heat data measured in intense magnetic fields on SC1A/3072 and SC1C/3072 composites are shown in FIGS. 3 and 4, respectively. The two composites behave very differently in intense magnetic fields. The specific heat maximum is depressed with field for SC1A/3072 composite, whereas the broad-based maximum is still retained even at 10 T for SC1C/3072 composite. The reason for peak-depression is not readily understood and would require fundamental studies.

Figures 5, 6, 7:
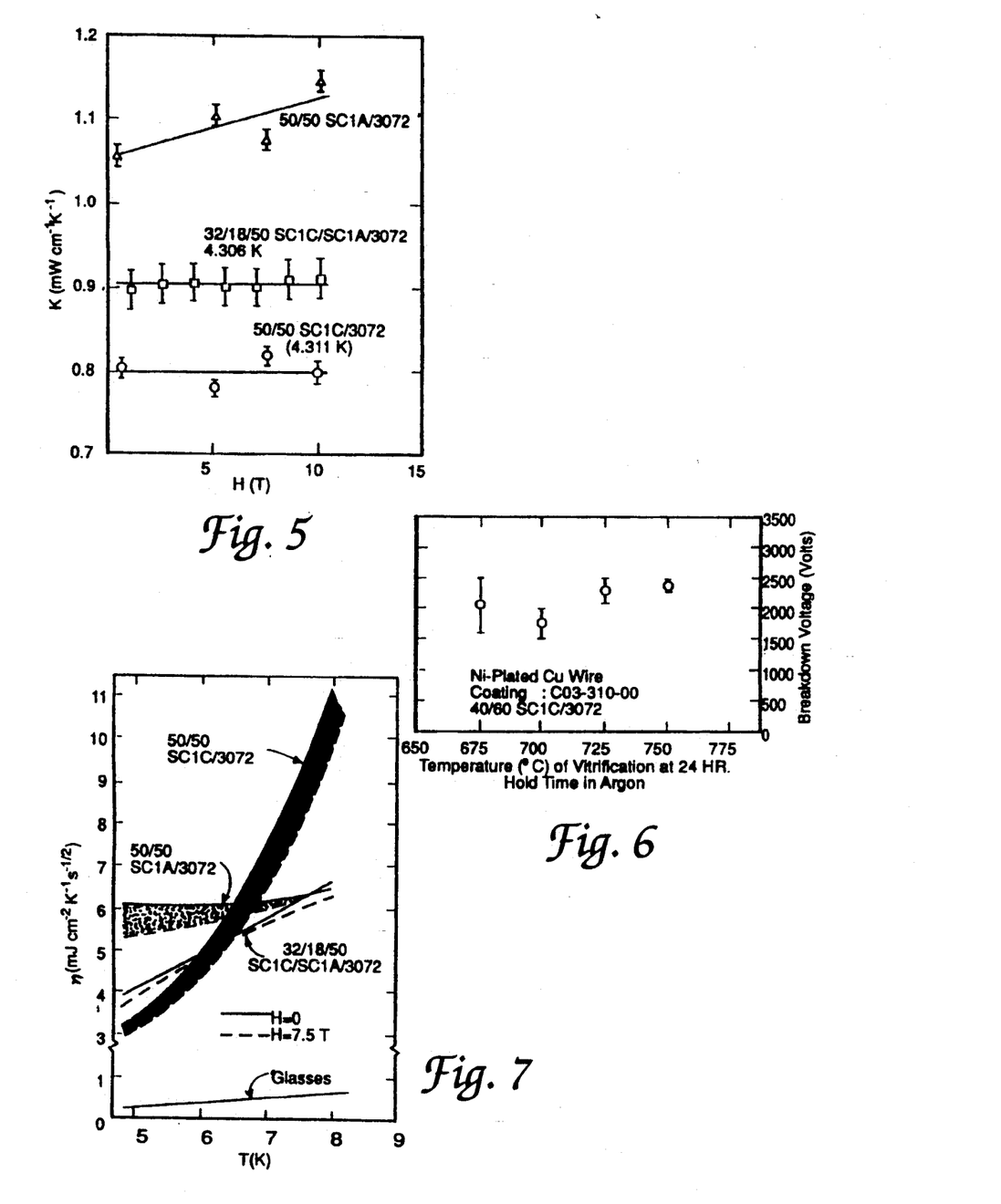
FIG. 5 is a graph showing the magnetic-field dependence of the thermal conductivities of ceramic/glass composites.
FIG. 6 is a graph showing the breakdown voltage of the dielectric coating as a function of vitrification temperature.
FIG. 7 is a graph showing the transient thermal parameter h as a function of temperature and field.

The thermal conductivity data for these composites, along with the ternary composite, are shown in FIG. 5. The experimental uncertainty for these measurements is shown by the error bars. The SC1C/3072 and SC1A/SC1C/3072 composites have apparently H-field independent thermal conductivities. The SC1A/3072 composite, however, appears to have a slight H-field dependent which cannot be attributed to experimental uncertainties.

COATED WIRE SAMPLES

The coating studies can be broadly divided into two categories: those conducted on Cu wire and those on Nb₃Sn wire. The bulk of the coating evaluation was done on samples made from Cu wire. This is due to the fact that most of Nb₃Sn wire has an exposed surface of Cu, and, as such, it was argued that an insulation system developed for Cu will apply equally well to Nb₃Sn. The other reason for testing Cu wire is the high cost and scarcity of Nb₃Sn wire. Both wires had Ni-plating on the outer surface. Tests were conducted on both "green" and "vitrified" twisted pairs. The thickness of the green coating was typically $5.5 \times 10^{-3}$–$7.5 \times 10^{-3}$ cm (2–3 mil) and that of the vitrified coating was typically $2.5 \times 10^{-3}$–$3.8 \times 10^{-3}$ (1–1.5 mil).

Typical examples of mechanical and electrical characteristics of the "green" dielectric coatings applied on both Cu and Nb₃Sn wires are shown in Table 1. Since no standard test parameters were generated along the line of organic enamel coating modified by the brittle nature of the ceramic/glass coating. The test data presented in Table 1 when compared with the characteristics of a typical organic insulation can be considered quite satisfactory. The coating exhibits high flexibility and high resistance to scrape and abrasion, and high electrical strength. The breakdown strength of the vitrified coating as a function of vitrified temperature is shown in FIG. 6 for Ni-plated Cu wire. These data represent one of the best breakdown voltages obtained in this program and are substantially in excess of 500 volts targeted for this program. These coatings also showed excellent adhesion to the wire after vitrification, and in some cases sand blasting was required to remove the coatings from the wire.

DISCUSSION

What we have tried to demonstrate is a novel method of enthalpy stabilization of superconducting magnet through the development of inorganic film-type coatings on Nb₃Sn wire, the coating having the characteristic of high thermal capacity combined with high electrical strength. Taking the case of enthalpy stabilization, it is instructive to evaluate the h-parameters for the composites from the thermal data of the bulk samples. The procedure followed was to compute h for $H=0$ and $H=7.5$ T using the appropriate specific heat, thermal conductivity, and density data. The h-parameter data at temperature 5°–8° K. are shown in FIG. 7 where the band of h-values ($H=0$, 7.5 T) is shown for each of the three composites discussed in this paper. Also shown for comparison are the h-data for glasses which are the only other potential dielectric insulation for Nb₃Sn. The composites represent an improvement in the h-parameter Z20 times.

One can conclude that for 50/50 ceramic/glass composites, the SC1A/3072 composite is superior up to 6.5° K.; the SC1C/3072 composite is superior above 6.5° K. The ternary SC1C/SC1A/3072 composite appears to offer no particular advantage. For all composites, the h-parameters are decreased by the field ($H=7.5$ T), but this suppression is relatively minor. This is one of the major findings in this program; namely that the thermal properties of these insulation coatings are not greatly affected by intense magnetic fields.

Turning to the dielectric coating, it can be stated that the inorganic film-type coating consisting of a ceramic and a glass offers a very satisfactory solution to the conflicting requirements of a high reaction temperature Nb₃Sn and a low use temperature (4°–8° K.) of superconducting environment. The additional attractive feature is that the coating formation (vitrification) and Nb₃Sn reaction can be accomplished simultaneously. The vitrified coating shows a high degree of scrape and abrasion resistance combined with resistance to thermal shock upon immersion to liquid nitrogen or helium bath. The vitrified coating maintains a high insulation resistance with resistivity values measured at p N 11–12 ohm-cm and a high breakdown voltage with values in excess of 500 volts, both in liquid nitrogen. Furthermore, the residual resistance ration (RRR), measured for coated and uncoated wires which were heat treated similarly, showed no significant difference in values. The coating is very compatible with the Nb₃Sn wire.

TABLE II

"Green" Coating Characteristics
Coating Identification CO3-310-00
Coating Composition 40/60 SC1C/3072

| Parameters | Ni-Plated Cu Wire | Ni-Plated Nb₃Sn Wire |
|---|---|---|
| Wire Size | #20 AWG | #20 AWG |
| Coated Surface | Fairly Smooth | Very Smooth |
| Build | $5.0 \times 10^{-3}$ cm (2 mil) | $5.0$–$5.5 \times 10^{-3}$ cm 2.0–2.2 mil) |
| Flexibility: | | |
| 1. Quick Snap | passes | passes |
| 2. Elongation + 5X Mandrel Wrap | 20% | greater than 5% |
| 3. e bend | passes | passes |
| Scrape Abrasion (No. of cycles @ 350 g lead) | 33, 48, 56 52, 63, 17 | 12, 34, 24 36, 22, 18 |
| Electric Breakdown (volts) | 1000, 960, 820 790, 920, 990 | 1700, 1600, 1250 1200, 1100, 1500 |
| Insulation Resistance | greater than | greater than |

TABLE II-continued

"Green" Coating Characteristics
Coating Identification CO3-310-00
Coating Composition 40/60 SCIC/3072

| Parameters | Ni-Plated Cu Wire | Ni-Plated Nb$_3$Sn Wire |
|---|---|---|
| megohms @ 50 volts (on twisted pair) | 20,000 | 20,000 |

Finally, the green coating is highly conformable; i.e., it is extremely amenable to coil formation which can be vitrified to give final coil configuration. This then readily conforms to the "react-after-winding" (RAW) scheme that is now being pursued in a separate Air Force program for making small coils of Nb$_3$Sn wire.

CONCLUSION

The Nb$_3$Sn superconductor wire promises to provide high power density and low losses for superconducting magnets and generators for which there had been no adequate insulation system for the wire because of its high reaction temperature. This invention describes the first breakthrough in the development of an inorganic insulation coating for Nb$_3$Sn wire which will withstand the mechanical, electrical and thermal transients developed during excitation of a superconducting magnet. The major achievements are the (1) development of a barrier metal layer e.g. Ni on which an inorganic insulation can be satisfactorily built, (2) development of a composite composition of a glass and a ceramic where the reaction temperature coincides with the vitrification temperature and finally, (3) development of an insulation system where the improved enthalpy stabilization and electrical insulation are simultaneously built into the insulation.

HIGH TEMPERATURE AND RADIATION RESISTANT INORGANIC EMBODIMENT

In the past, the use of inorganic coating such as ceramics has been severely limited due to difficulty in fabrication and to the brittle nature of these materials. We have overcome these problems by developing a composite insulation coating consisting of a mixture of glass (M3073) and ceramic in the final form of the insulation. The adherence of this coating to the conductor wire such as nickel plated copper is so tenacious that a coated and vitrified wire can be wrapped around its own diameter without spalling, cracking or abrading. Its abrasion resistance is at least ten times that of an organic material and exhibits an elongation capability up to 20%. Its stretching and bending characteristics allow winding of coils which can be subsequently encapsulated. Electrical strength of 500-1000 volts/mil of coating have been obtained with considerable room for improvement. A 0.6-1.0 mil coating is capable of withstanding up to 750° C. without deterioration. It also passed the quick jerk (adhesion) test. Another major advantage is that there is no danger of toxic fumes since all organic materials in the coating itself have been eliminated. Finally, the insulation can be applied not only to nickel plated copper wire but to other conductor wires e.g., Inconel, Cr, steel, etc.

The above conditions have been found using the M3073 glass described below, but may be applicable to other glasses if the firing technique is carried out as applied by the Advanced Reactor Division of Westinghouse Electric Corp., that is long time conditioning (at least 16-24 hours) at 750° C. The formation of NiO with subsequent diffusion of nickel oxide into glass ceramic, accounts for the good adhesion.

The insulation is composed of a ceramic composite consisting of a mixture of glass and ceramic oxide(s), coated onto the wire by the conventional wire enameling technique followed by heat treatment at 600°-850° C. The enamel when initially applied to the conductor is called the "green" coat and after the heat treatment as appropriate temperatures is called the "fired" or "vitrified" coat. Coiling is conveniently done with the "green" coat using a standard coiling machine; the whole coil can then be subjected to heat treatment for final vitrification of the inorganic coating in air or in an inert atmosphere, e.g., argon.

The "green" coat consists of four components: (1) the glass, (2) an inorganic filler, (3) an organic binder and (4) an organic solvent. The purpose of the glass is to provide an adhesive coating onto the wire upon vitrification; the glass can be tailored to achieve a desired vitrification temperature which is compatible with the melting temperature of the conductor. The inorganic filler is typically a ceramic oxide powder with special properties. The purpose of the filler material is to provide improved properties, e.g., electrical resistance, as well as to provide some mechanical strength through powder dispersion in the composite. The organic binders provide the bonding strength and flexibility in the "green" coat, and solvents are necessary to prepare the composite mixture prior to the application of the coating onto the wire.

In applying the coating, the components are mixed in appropriate proportions into a slurry and the conductor is then drawn through the slurry by using a suitable die as in conventional enamel coating. A few tenths of a mil of coating are built each time the wire passes through the die. Typically, 3-5 passes are required to build appropriate coating thickness.

From the coating die, the wire goes to a heated tower where the solvent is removed and the binder containing the glass plus ceramic is cured. The temperature of the curing tower is maintained at 300°-400° C. and the wire is exposed to for a period of about 30 seconds. At this stage, the wire is still flexible and could be wound and unwound on a spool without cracking the inorganic coating.

The final vitrification of the coating is done at a higher temperature in the range of 600°-650° C. The temperature of the final vitrification is determined by the vitrification temperature of the glass with the vitrification time varying between 8 and 64 hours. The 64-hour vitrification period is preferred at the high temperature to allow the formation of a nickel oxide that then will diffuse into the inorganic glasses to form a metal complex bond (see the photograph of FIG. 2). Prior to vitrification, the organic binder is driven off at a temperature of about 400° C. for 4-16 hours.

The proportion of various ingredients in the slurry may be as follows:
Glass: 15-45 wt %
Inorganic oxide: 30-65 wt %
Organic binder: 15-50 wt %
Solvent/solid ratio: approximately 50:50 wt %

Several commercial glasses as well as some Westinghouse glasses were evaluated. Examples of these glasses are:
Corning 7570
Corning 7050

Westinghouse A-508
Westinghouse M 3072
Westinghouse M 3073

Westinghouse glasses showed far superior physical and electrical properties and are, therefore, the most desirable candidate glasses for the coating. Their compositions are shown in Table I. The A-508 glass melts at about 1300° C., the M3072 at about 1590° C., and M3073 at about 1925° C. This is due to increasing refractoriness of the glasses. The vitrification temperatures are also correspondingly higher, A-508 about 650°-700° C., M3072 about 700°-750° C., and M3073 about 800°-850° C. The M3073 glass is preferred, because of its high vitrification, the glass diffuses into the metal oxide layer to form a very strong adherent insulating bond. Note that these glasses contain no lead or boron, which makes them ideal for nuclear applications. In all cases, the glass compositions are melted in Lava Seal Crucible, fritted in water, dried and ground to fine powders in methanol and screened to −323 mesh after final drying.

The inorganic filler materials are generally oxide ceramic powders such as $Al_2O_3$, $ZrO_2$, $SiO_2$, MgO, $CaZrO_3$, etc., or CeramPhysics ceramics such as the SC1C or SC1A described above. A typical oxide is Alcoa alumina designated as A-14, but other fine powders are equally suitable. The particle size is typically 1-5 micrometers. Finer powder can also be used.

The binder materials are selected in such a way that they are completely burnt off during intermediate heat treatment at about 400° C. for several hours. Any residual binder could burn off during the excursion to vitrification temperature. Various organic binders can be used for this purpose, including polyester 2415 (Westinghouse), Acryloid B82 and B44 (Rhom & Hass), polyvinyl acetate B800 (AIRCO Chemical and Plastic), Elvacite 6014 (DuPont) etc. A typical organic binder is Acryloid B82 which gives good flexibility and smoothness to the coating and burns off completely with no residue. During the burn-off period, it is desirable to maintain a flow of air, but it is not mandatory. The Acryloid B82, for example, will decompose to the monomer and evaporate.

The solvents used to make the slurry are typically toluene and xylene. Although the inorganic insulation as described above has been applied to various conductor wires, a special surface preparation is required for copper wire, the most common conductor wire for a variety of applications. It was discovered that bare copper wire shows poor adhesion to inorganic insulation due to the formation of a scale of copper oxide which flakes off upon cooling from vitrification temperature. To avoid this problem, an intermediate layer of another metal which forms a strongly adhered oxide layer of another metal which forms a strongly adhered oxide layer on the surface of the parent metal is conveniently placed between the copper and the inorganic insulation. The preferable intermediate metal layer is Ni, Inconel and Cr, in that order. The intermediate layer of metal can be placed on the surface of the copper either by cladding or plating and thickness of this metal layer may be as low as approximately 5 micrometers. It is also obvious that when the insulation is to be applied on conductors other than copper wire, no such intermediate metal layer is required.

Some typical properties on #18 AWG Ni-clad copper wire after vitrification are summarized below.

a. Insulation build—0.6-1.0 mils
b. Quick snap (adhesion) passes
c. 20% elongation+1×diameter mandrel-passes-fails slightly at 25% elongation
d. Electric strength at RT—500-1000 volts/mil
e. Electric strength @ 500° C.—200-300 volts/mil
f. High radiation resistance $-1.9 \times 10^{20}$ nvt @ 600° C.
g. Insulation resistance @ RT of the twisted wire approx. $10^3$ Megohms
h. Excellent adhesion of the coating after vitrification
i. No flame or toxic fumes on direct contact with fire
j. No short between twisted wire up to a temperature of about 750° C.

Figure 8:
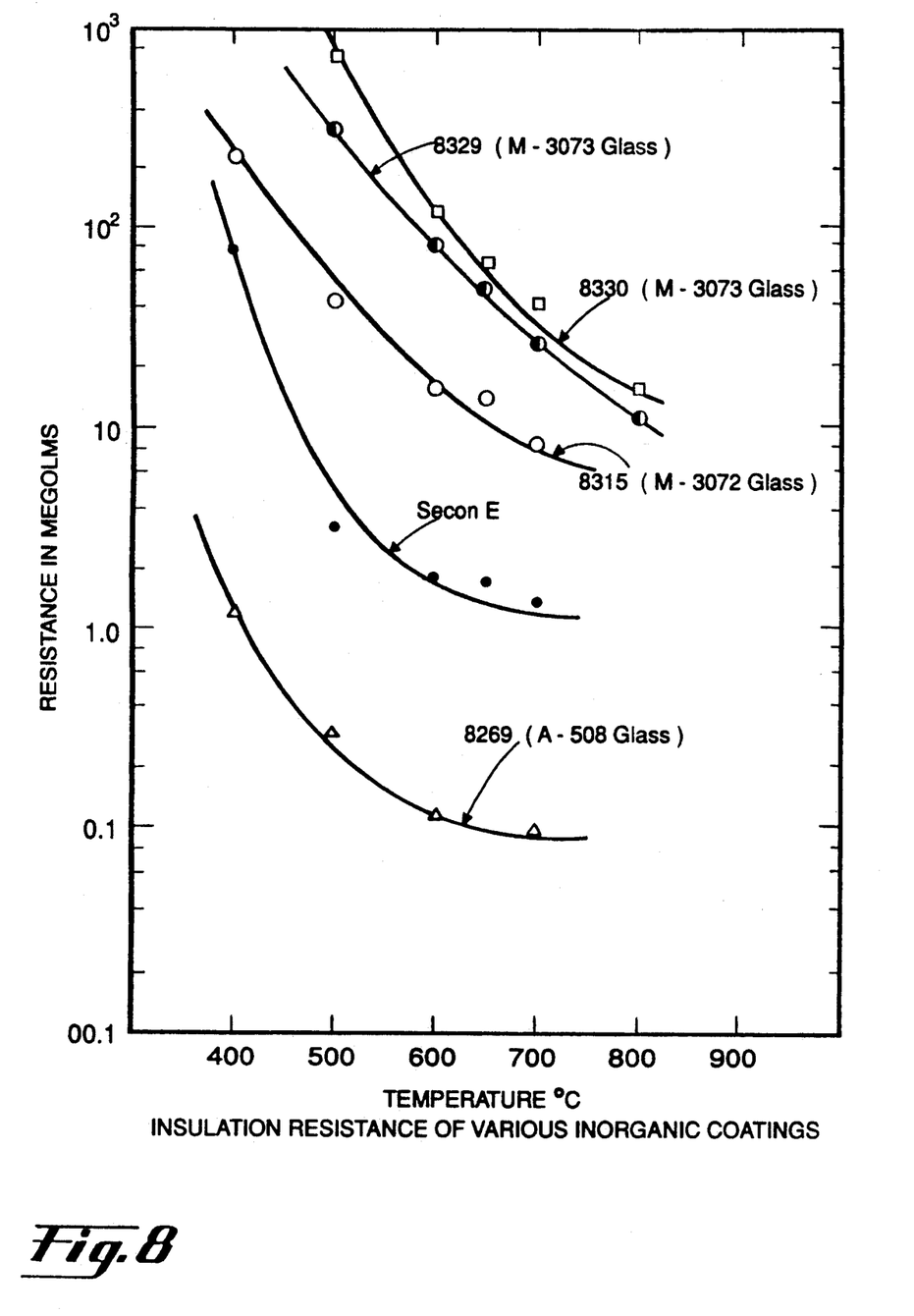
FIG. 8 is a graph showing the insulation resistance of various inorganic coatings.

The typical insulation resistance of twisted pair of wires as a function of temperature is shown in FIG. 8 for some selected compositions.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. The method of making an inorganic insulation system for superconducting $Nb_3Sn$ wire embedded in a copper matrix, for fast pulse superconducting magnets and energy storage devices which require high current, high field, low loss, stable superconductors and associated insulation systems, which can withstand a high formation temperature and yet be electrically satisfactory at low use temperature (4°-8° K.), and which is able to absorb energy dissipated during fast charge and discharge of a magnet, comprising the steps:

forming a protective coating layer on the wire with a metal selected from the class consisting of Ni, inconel and Cr;

preparing a slurry which comprises a mixture of 35-45% glass, 20-30% of an inorganic ceramic oxide powder, 30-40% of an organic binder and a solvent, chosen so that the vitrification temperature coincides with the superconducting formation temperature of 600°-800° C.

with the glass selected from the group consisting of a first glass (A-508) of a composition comprising by weight approximately 40% $SiO_2$, 6% $Al_2O_3$, 12% $K_2O$, 8% $Na_2O$, 10% BaO, 2% SrO, 3% CaO; and a second glass (M3072) of a composition comprising by weight approximately 55% $SiO_2$, 4% $Al_2O_3$, 11% $Na_2O$, 20% BaO, 6% CaO, and 4% $Y_2O_3$; and the ceramic selected from the group consisting of a first ceramic (SC1C) having a chromite-spinal type structure with a specific heat maximum at 8° K. of 2 J cm$^{-3}$K$^1$, a second ceramic (SC1A) having a niobate-columbite type structure having a specific heat maximum at 4.2° K. of 0.3 J cm$^{-3}$K$^1$ (SC1A), and a mixture which includes said first and said second ceramics;

drawing the wire through the slurry to form a green coating;

and heat treating the coated wire at 600°-800° C. to form a vitrified coating on the wire at said temperature, the vitrified insulation being 55-65% glass and 35-45% ceramic.

2. The method of making an inorganic insulation system for superconducting $Nb_3Sn$ wire embedded in a copper matrix, for fast pulse superconducting magnets and energy storage devices which require high current, high field, low loss, stable superconductors and associated insulation systems, which can withstand a high formation temperature and yet be electrically satisfactory at low use temperature (4°-8° K.), and which is able to absorb energy dissipated during fast charge and discharge of a magnet, comprising the steps:

forming a protective coating layer of the wire with a metal selected from the class consisting of Ni, inconel and Cr;

preparing a slurry which comprises a mixture of 35-45% glass, 20-30% of an inorganic ceramic oxide powder, 30-40% of an organic binder and a solvent, chosen so that the vitrification temperature coincides with the superconducting formation temperature of 600°-800° C.; said glass (M3072) being of a composition comprising by weight 40-60% $SiO_2$, 2-6% $Al_2O_3$, 6-13% $Na_2O$, 15-25% BaO, 3-10% CaO, and 2-10% $Y_2O_3$; and the ceramic (SC1C) being of a type which has a chromite-spinal type structure with a specific heat maximum at 8° K. of 2 J $cm^{-3}K^1$. drawing the wire through the slurry to form a green coating; and heat treating the coated wire at 600°-800° C. to form a vitrified coating on the wire at said temperature, the vitrified insulation being 55-65% glass and 35-45% ceramic.

3. The method according to claim 3, wherein the step of preparing a slurring comprises preparing the slurry with the glass (M3072) of a composition comprising by weight 55% $SiO_2$, 4% $Al_2O_3$, 11% $Na_2O$, 20% BaO, 6% CaO, and 4% $Y_2O_3$.

* * * * *